(12) United States Patent
Wolfe et al.

(10) Patent No.: US 7,570,045 B2
(45) Date of Patent: Aug. 4, 2009

(54) ATTACHMENT DEVICE AND METHOD FOR FASTENING ELECTRICAL CABLE MONITORING INSTRUMENTS TO ELECTRICAL CABLES

(75) Inventors: Gregory Robert Wolfe, Royersford, PA (US); William Eakins Ferguson, Jr., Pennsburg, PA (US); Andrew Paul Sagl, Norristown, PA (US); Jeffrey Lyn Stitt, Levittown, PA (US)

(73) Assignee: James G. Biddle Company, Norristown, PA (US)

( * ) Notice: Subject to any disclaimer, the term of this patent is extended or adjusted under 35 U.S.C. 154(b) by 0 days.

(21) Appl. No.: 11/548,700

(22) Filed: Oct. 12, 2006

(65) Prior Publication Data

US 2008/0088299 A1    Apr. 17, 2008

(51) Int. Cl.
*G01R 33/00* (2006.01)
*G01R 19/14* (2006.01)
(52) U.S. Cl. ........................... 324/127; 324/133
(58) Field of Classification Search ................. 324/149, 324/127, 133, 142, 117 H, 117 R; 336/174–176; 340/664, 870.02
See application file for complete search history.

(56) References Cited

U.S. PATENT DOCUMENTS

| | | | |
|---|---|---|---|
| 2,190,143 A | | 2/1940 | Barnest et al. |
| 2,430,730 A | | 11/1947 | Bowen |
| 4,086,529 A | | 4/1978 | Schweitzer, Jr. |
| 4,288,743 A | | 9/1981 | Schweitzer |
| 4,354,154 A | * | 10/1982 | Schiemann ................. 324/126 |
| 4,456,873 A | | 6/1984 | Schweitzer, Jr. |
| 4,646,006 A | | 2/1987 | Schweitzer, Jr. |
| 4,794,329 A | * | 12/1988 | Schweitzer, Jr. ............ 324/127 |
| 4,839,600 A | | 6/1989 | Kuurstra |
| 4,998,060 A | | 3/1991 | Yeh |
| 5,057,769 A | | 10/1991 | Edwards |
| 5,180,972 A | | 1/1993 | Schweitzer, Jr. |
| 5,565,783 A | | 10/1996 | Lau et al. |
| 5,729,125 A | | 3/1998 | Schweitzer, Jr. |
| 5,990,674 A | | 11/1999 | Schweitzer, Jr. |
| 6,016,105 A | * | 1/2000 | Schweitzer, Jr. ............ 340/664 |
| 6,043,433 A | | 3/2000 | Schweitzer, Jr. |
| 6,133,723 A | | 10/2000 | Feight |
| 6,133,724 A | | 10/2000 | Schweitzer, Jr. et al. |
| 6,734,662 B1 | | 5/2004 | Fenske |
| 7,053,601 B1 | | 5/2006 | Fenske et al. |

* cited by examiner

*Primary Examiner*—Ernest F Karlsen
(74) *Attorney, Agent, or Firm*—Miodrag Cekic

(57) ABSTRACT

The present invention is an attachment device and a method for fastening and removing an electrical cable monitoring instrument to an electrical cable. The attachment device comprises monitoring instrument sensor with opening for positioning electrical cable such that said electrical cable can be positioned to pass through the sensitive volume at least partially surrounded by said sensor, at least one elongated elastic member securely attached to said cable monitoring instrument such that, when elastically deformed to a shape characterized by high mechanical energy such that deformed elastic member allows said electrical cable access to and from the sensitive volume at least partially surrounded by said monitoring instruments sensor. The elongated elastic member, when relaxed to the a shape characterized by lower mechanical energy than high mechanical energy shape, with the electrical cable positioned to pass through sensitive volume, applies elastic force to the electrical cable to hold the electrical cable passing through the sensitive volume firmly and securely in contact with the cable monitoring instrument with no relative motion.

12 Claims, 9 Drawing Sheets

ATTACHMENT DEVICE AND METHOD FOR FASTENING ELECTRICAL CABLE MONITORING INSTRUMENTS TO ELECTRICAL CABLES

FIELD OF THE INVENTION

The present invention relates generally to electrical cable monitoring instruments for electrical power distribution systems. More particularly, the present invention relates to devices and methods for fastening and removing electrical cable monitoring and recording instruments, such as fault indicators, voltage monitoring instruments, current monitoring instruments, resistance monitoring instruments and instruments that can perform combinations of said monitoring functions to monitored electrical cables.

BACKGROUND OF THE INVENTION

Electrical power distribution systems frequently require usage of a variety of distribution systems condition monitoring and recording instruments to control and optimize distribution systems operations and facilitate the detection and location of system malfunctions. The monitoring instruments may be applied either on predesigned test points for mounting of the system test points, or applied directly onto electrical cables of the distribution system at any position along the length of the electrical cable as needed.

The present invention is concerned in particular with electrical cable monitoring instruments that can be applied directly to, by at least partially surrounding with sensors, any chosen place on the electrical cable with or without insulation coating. The direct application should cause no interruption of the power distribution system functions, such as interruptions caused by disassembling of distribution system components, or turning off the power carried through the monitored cable.

The requirements for no interruption of the distribution system function, combined with the standard safety requirements and regulations motivate the preference for an attachment device for fastening an electrical cable monitoring instrument to an electrical cable safely and securely, using standard insulated road tool known to the practitioners of the electrical power distribution systems construction and maintenance as a hot stick. In addition to the hot stick compatibility, workers safety concerns strongly favor an attachment device and method for fastening an electrical cable monitoring instrument to an electrical cable which minimizes the application time and possibility for operators' errors.

DESCRIPTION OF THE PRIOR ART

Art of mechanically securing measuring instruments (fault sensors, ammeters, voltmeters and similar) to power cables and related clamping devices can be traced back to generative stages of the electric power distribution systems development. Early background prior art relevant to the current invention is described U.S. Pat. No. 2,430,703 to Bowen concerning linemen protective device that can be quickly applied to an energized electrical cable using an attachment device that surrounds the electrical cable at the chosen cable cross-section at the place of application.

More contemporary prior art includes predominantly patents assigned to E.O. Schweitzer Manufacturing Co, Inc. of Mundelein, Ill. U.S. Pat. Nos. 7,053,601 and 6,734,662 to Fenske, et al. (assigned to E.O. Schweitzer Mfg. Co. Inc.) depict in FIGS. 1-3 of the U.S. Pat. Nos. 7,053,601 and 6,734,662 clamp-on type cable fault indicators, which clamp directly over monitored cable using clamps characteristic of current E.O. Schweitzer Mfg. Co, Inc. products.

U.S. Pat. No. 6,133,723 to Feight (assigned to E.O. Schweitzer Mfg. Co. Inc.) describes clamp-on fault indicator which utilizes magnetic core and helical spring for clamping to a cable. Variations of depicted clamping scheme are also described in older E.O. Schweitzer Mfg. Co. Inc. patents (U.S. Pat. Nos. 5,990,674; 5,729,125; 5,180,972; and 4,456,873, all to Schweitzer, Jr.). The usage of helical spring for clamping in the described fashion can be traced back at least to the U.S. Pat. No. 2,190,143 to Barnes et al. filed 1937.

Somewhat different "automatic clamping mechanisms" for mounting line monitoring devices are described in the U.S. Pat. No. 4,646,006 to Schweitzer, Jr. and depicted in FIGS. 3-6 of the U.S. Pat. No. 4,646,006 to Schweitzer, Jr. Clamed principle advantage of this invention is the speed of clamp operation.

U.S. Pat. Nos. 4,288,743 and 4,086,529 to Schweitzer, Jr. describe clamp designed to secure cable in predefined position relative to magnetic pole pieces, used for reseating the fault indicator.

Separate group of prior art patents represent patents disclosing various forms of cable clamps for monitoring devices that secure to the monitored cables using screws threaded into clamp bodies. U.S. Pat. No. 6,043,433 to Schweitzer, Jr., U.S. Pat. No. 5,565,783 to Lau et al., U.S. Pat. No. 4,998,060 to Yeh, and U.S. Pat. No. 4,839,600 to Kuurstra are representatives of this group. Common design feature for clamps disclosed in listed patents is trade off of ease of installation and removal for the reliability of screws secured clamps.

In addition to patent literature, SensorLink Corporation of Acme (1975 Valley Hwy. S, Acme, Wash. 98220) manufactures and sells cable monitoring and recording instruments with sensors that partially encircle electrical cables under monitoring utilizing elastomeric cable attachment devices. The schematic of the SensorLink® Recorder is given in FIG. 1. The device sensor 10, based on the technology protected by the U.S. Pat. No. 5,057,769 to Edwards, partially encompasses sensitive volume 20. Elastomeric members 30, 40, and 50 are arranged such that elastomeric members 30 and 40 are placed at least partially inside the sensitive volume 20. The sensitive volume also contains elastic organic material foam bodies 60 and 70 designed to act as additional elastic energy storage devices. A hot stick mounting bracket 80 is attached to the Recorder body.

Inherent problems of the SensorLink Corporation design resolved by current invention are: difficulty to correctly apply the fastening device, reliance on the friction force dependent on the air temperature and other external factors, higher elastic energy of the device when it engages the electrical cable than when the cable is outside the sensitive volume 20, resulting in tendencies of the system to gradually expunge the cable from the sensitive volume 20 especially during high wind conditions.

The difficulty to correctly apply the device of prior art is particularly troublesome because it causes not only unnecessarily prolonged exposure of the operator to the potentially dangerous conditions associated with the proximity of the energized electrical cable, but also fatigue, frustration, and related loss of dexterity of the operator after repeated unsuccessful attempt to install the device, that can endanger other members of the working team.

SUMMARY OF THE INVENTION

The present invention provides attachment devices and methods for fastening an electrical cable monitoring instrument to an electrical cable designed to overcome the principle difficulties of the devices of prior art. By the use of elongated elastic members in the form of rods or elastic spring wires, helical springs or elastomeric bodies attached to the cable monitoring instruments and positioned at least partially outside the sensitive volume, the application of the instrument can be achieved by a fast uninterrupted manipulation of a hot stick.

In addition, the present invention results in a secure and stable attachment of the electrical cable monitoring instrument to the electrical cable that is relatively insensitive to the outside air temperature and wind conditions. Furthermore, the removal of the electrical cable monitoring instrument from the electrical cable is equally fast and completely intuitive, minimizing the risks of entanglement or electrical cable and monitoring equipment damage.

BRIEF DESCRIPTION OF THE DRAWINGS

Like reference numerals identify like parts throughout the drawings.

DETAILED DESCRIPTION OF THE INVENTION

Figure 2:
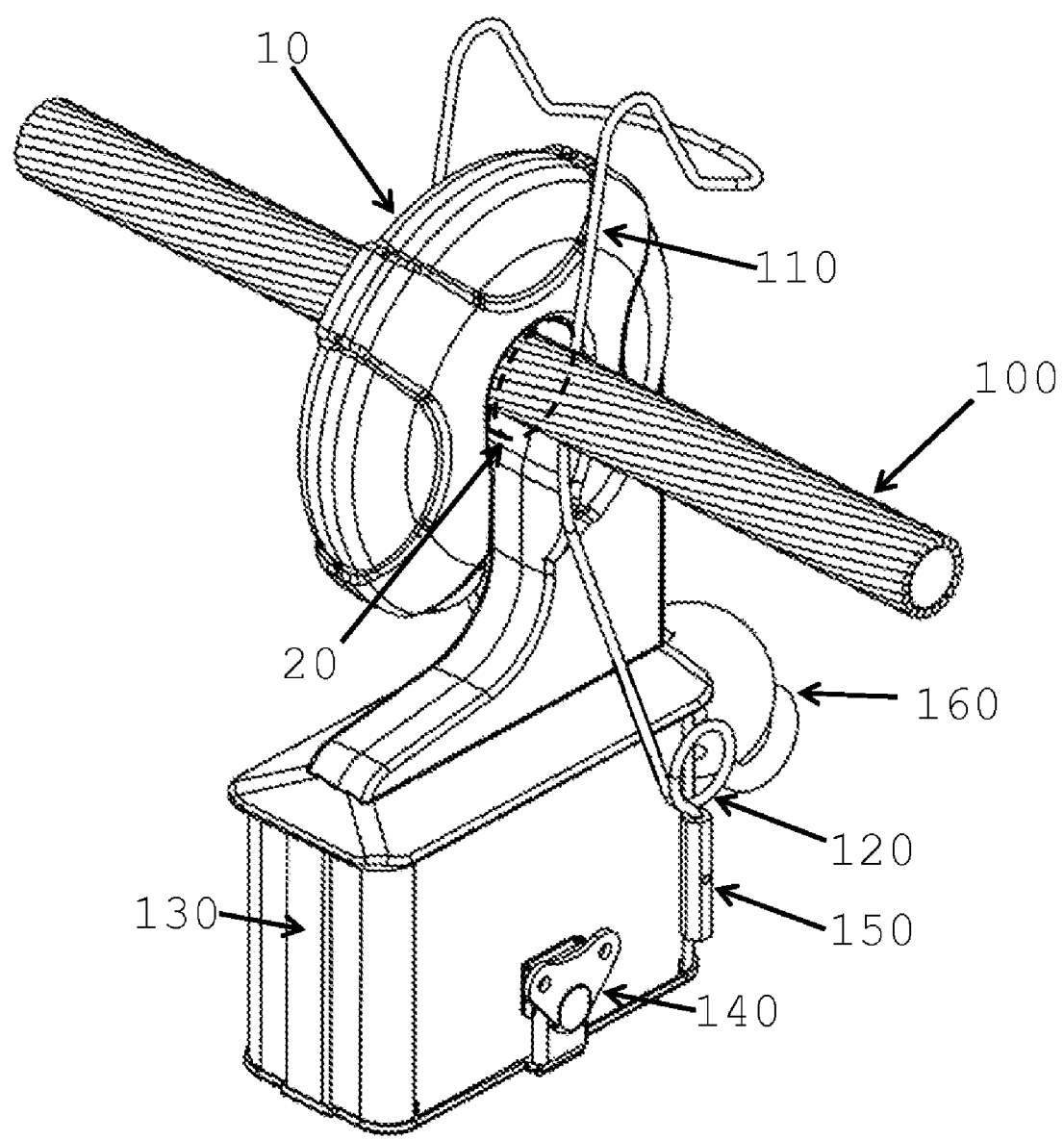
FIG. 2. is a schematic isometric view of a device in accordance with the preferred embodiment of the present invention.

A schematic of an isometric view of the preferred embodiment attachment device for fastening an electrical cable monitoring instrument to an electrical cable is shown in FIG. 2. The electrical cable under monitoring 100 is at least partially surrounded by the monitoring instrument sensor 10 while positioned to pass through the sensitive volume 20. At least one elongated elastic member 110 is deformed to a shape characterized by relatively lower mechanical energy such that deformed elastic member allows said electrical cable access to the sensitive volume at least partially surrounded by said monitoring instruments sensor 10. Additional mechanical energy is stored in short helical spring 120.

During the processes of attachment and disconnection of the electrical cable monitoring instrument said elongated elastic member 110 transients through a state characterized by high mechanical energy. When relaxed to the a shape characterized by lower mechanical energy than said high mechanical energy shape, with the electrical cable 100 positioned to pass through said sensitive volume 20, said elongated elastic member 110 applies elastic force to said electrical cable 100 to hold the electrical cable 100 passing through the sensitive volume 20 firmly and securely in contact with the cable monitoring instrument with no relative motion.

In the preferred embodiment device, at least one elongated elastic member 110 is securely attached by the attachment piece 150 to the Faraday shield 130 that encapsulate electronics compartment of the cable monitoring instrument by the use of latch 140. Faraday shield that partially encloses the electrical cable monitoring instrument also caries a mounting bracket 80 to which the hot stick adapter 160 is attached.

Figure 3:
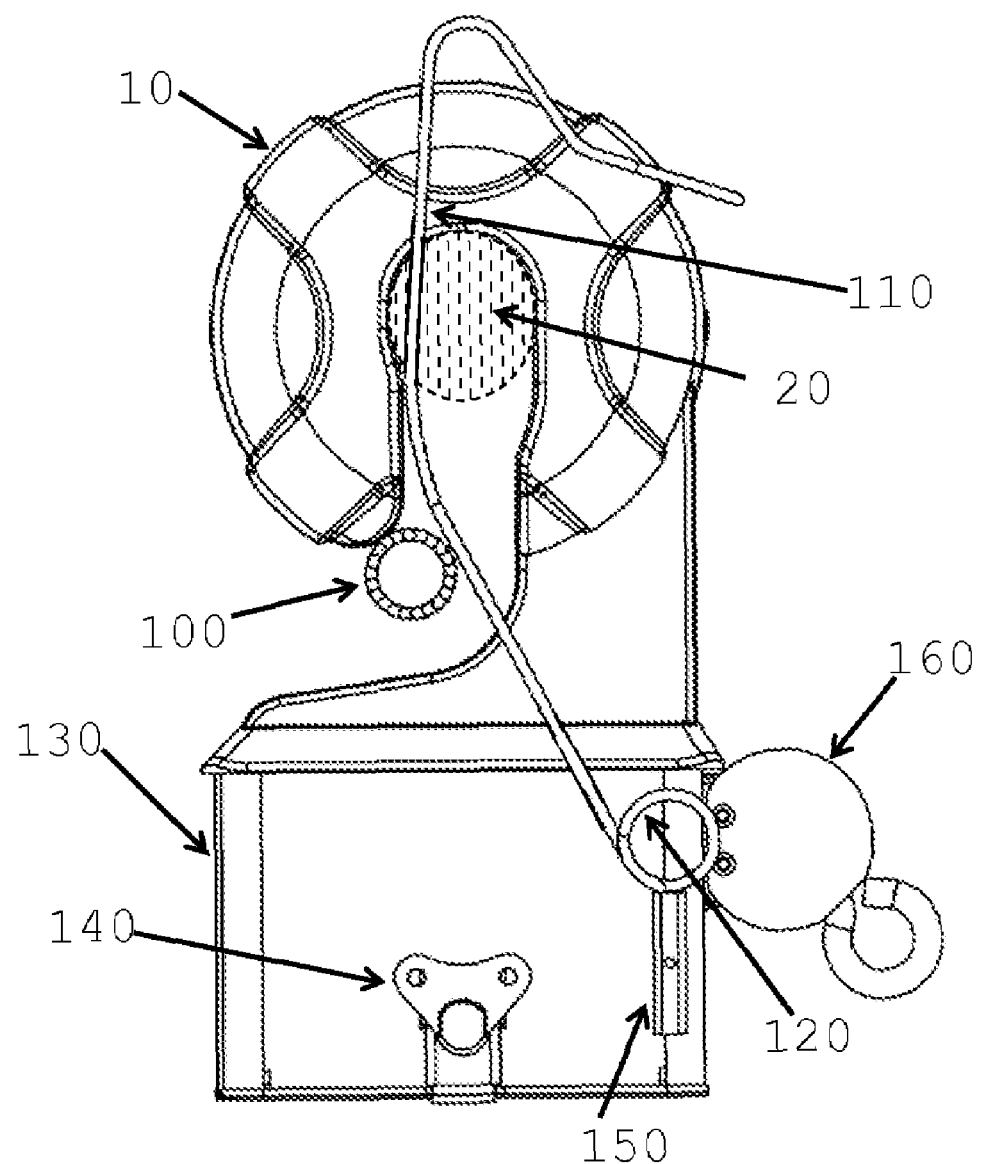
FIG. 3. is a schematic cross-sectional view of a device in accordance with the preferred embodiment of the present invention.

FIG. 3. shows a cross-sectional view of the preferred embodiment attachment device for fastening an electrical cable monitoring instrument to an electrical cable at a point in time just before the electrical cable 100 engages at least one elongated elastic member 110. The elongated elastic members 110 and the short helical springs 120 are depicted undeformed, defining an mechanical energy state characterized by zero mechanical energy.

Figure 4:
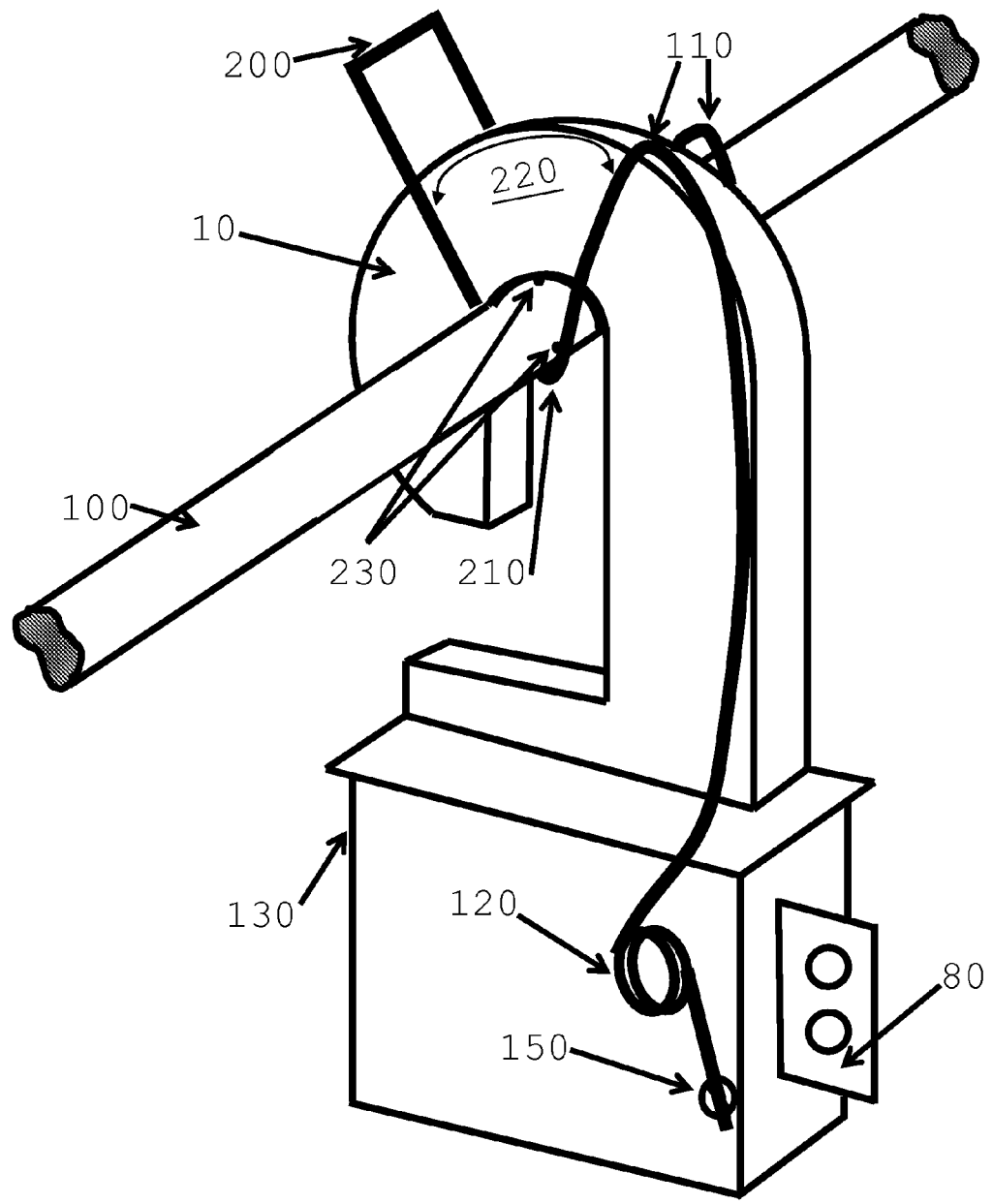
FIG. 4. is a schematic isometric view of a device in accordance with an additional embodiment of the present invention.

A schematic of an isometric view of a different embodiment attachment device for fastening an electrical cable monitoring instrument to an electrical cable is shown in FIG. 4. The attachment device for fastening an electrical cable monitoring instrument to an electrical cable 100 comprises two elongated elastic elongated members 110 joint by a connecting member 200. The elongated elastic members 110 are deformable in the plane perpendicular to the electrical cable axis further comprise one or more concave portions 210 when observed from the direction originating on the cable axis, said concave portion or portions 210 having openings 220 larger than the diameter of said electrical cable.

The principle feature of the attachment device embodiment, as shown in FIG. 4., is security and stability of the attachment. The electrical cable monitoring instrument contact the electrical cable 100 in at least six points 230 (two points are clearly visible in FIG. 4.) approximately symmetrically spaced on the electrical cable surface. This arrangement spread the moments of external wind forces symmetrically around the cable preventing disconnection caused by any rotational motion of the monitoring instrument relative to the electrical cable 100.

Figure 5:
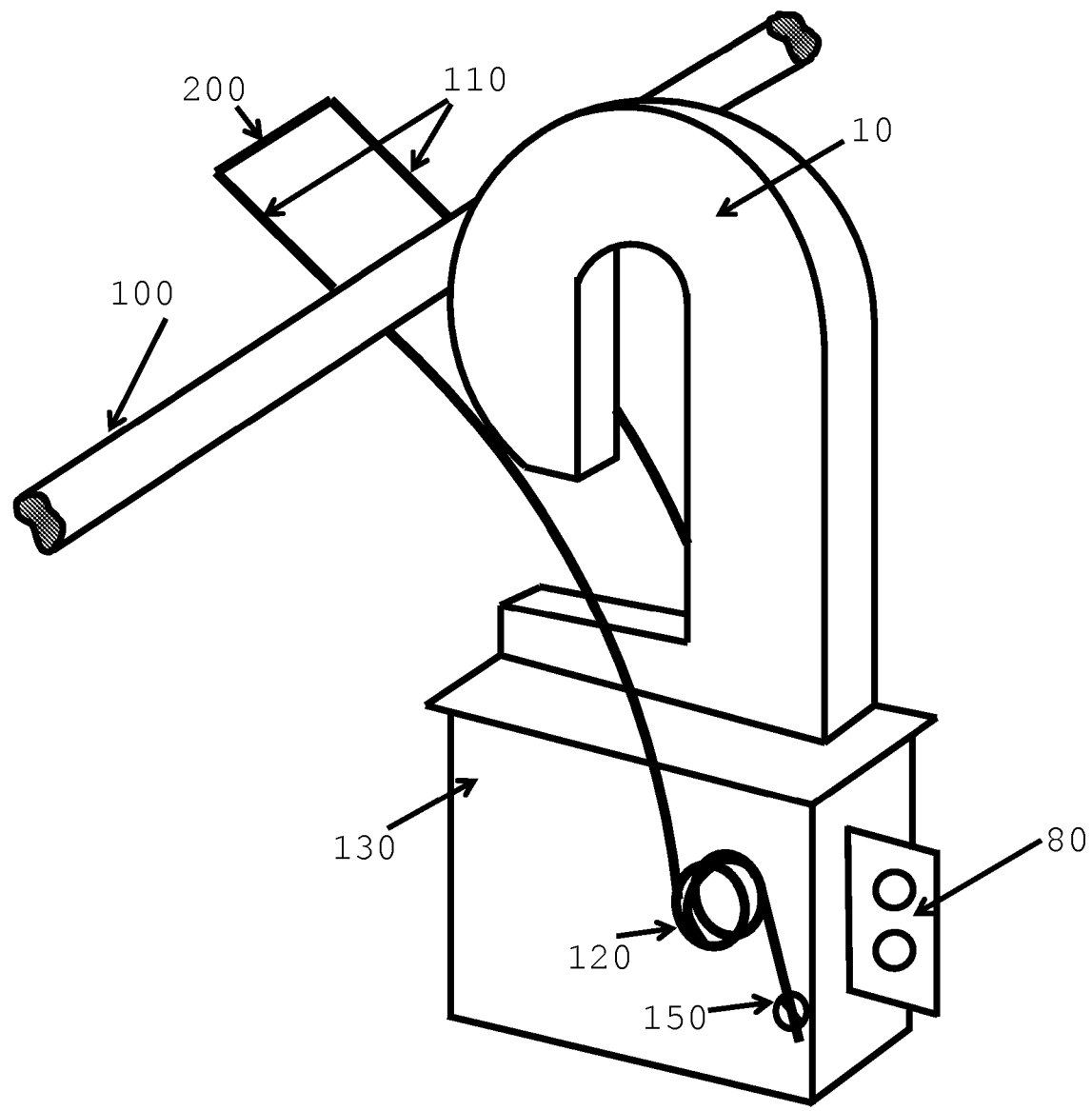
FIG. 5. is a schematic isometric view of a device in accordance with another additional embodiment of the present invention.

An additional embodiment of the present invention is shown in FIG. 5., during the process of attachment of the cable monitoring instrument to the electrical cable 100. The elastic elongated members 110 and short helical spring 120 are depicted in a deformed state close to the state of maximum mechanical energy achieved during the attachment process. In this embodiment the mechanical energy is shared between the elongated elastic members 110 and short helical springs 120.

Figure 6:
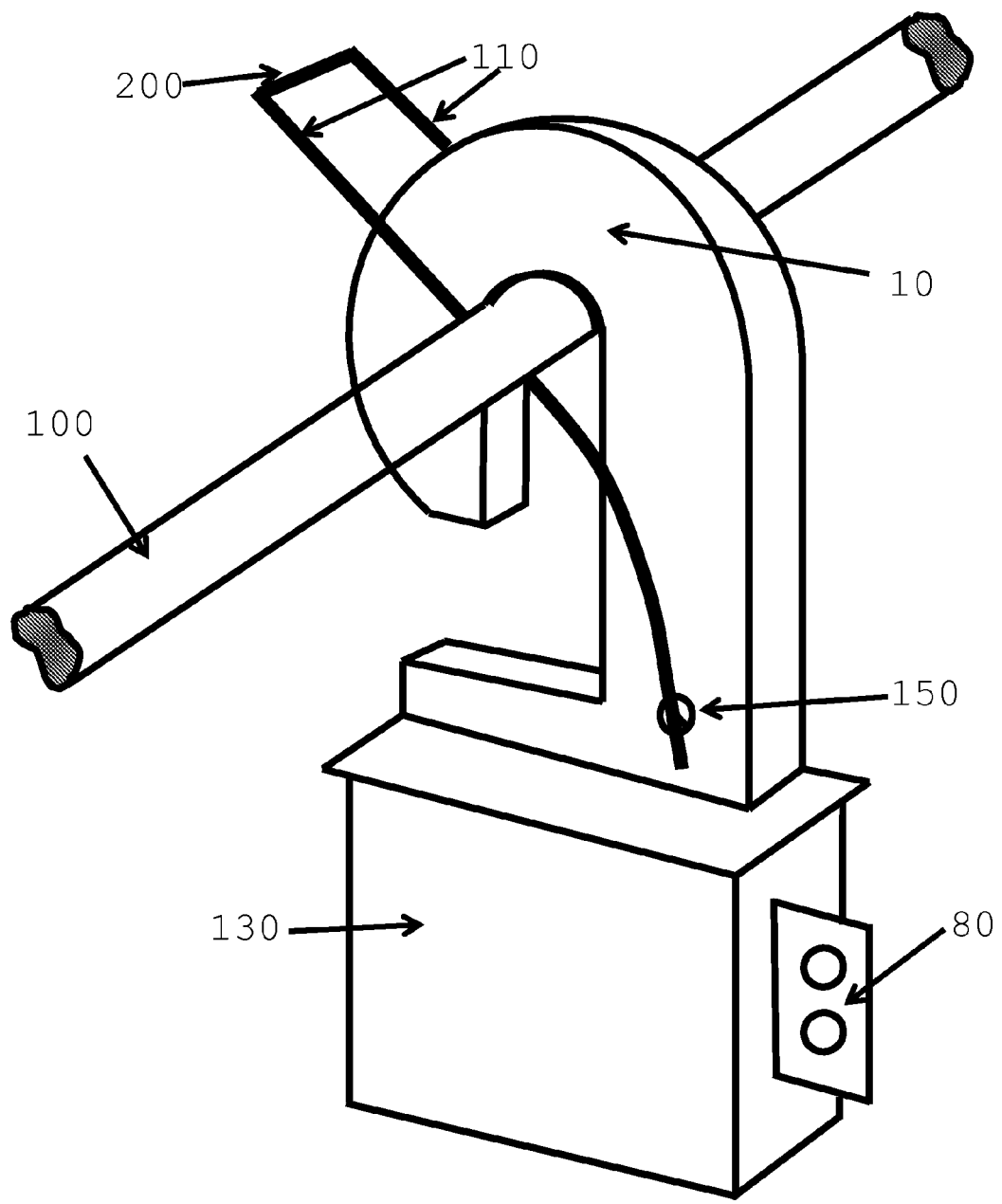
FIG. 6. is a schematic isometric view of a device in accordance with yet another additional embodiment of the present invention.

FIG. 6. shows schematically yet another embodiment of present invention. In this embodiment mechanical energy is stored in the deformations of elongated elastic members 110. In addition, the elongated elastic members 110 are attached to the monitoring instrument sensor 10 not enclosed by and separate from the Faraday shield 130.

Figure 7:
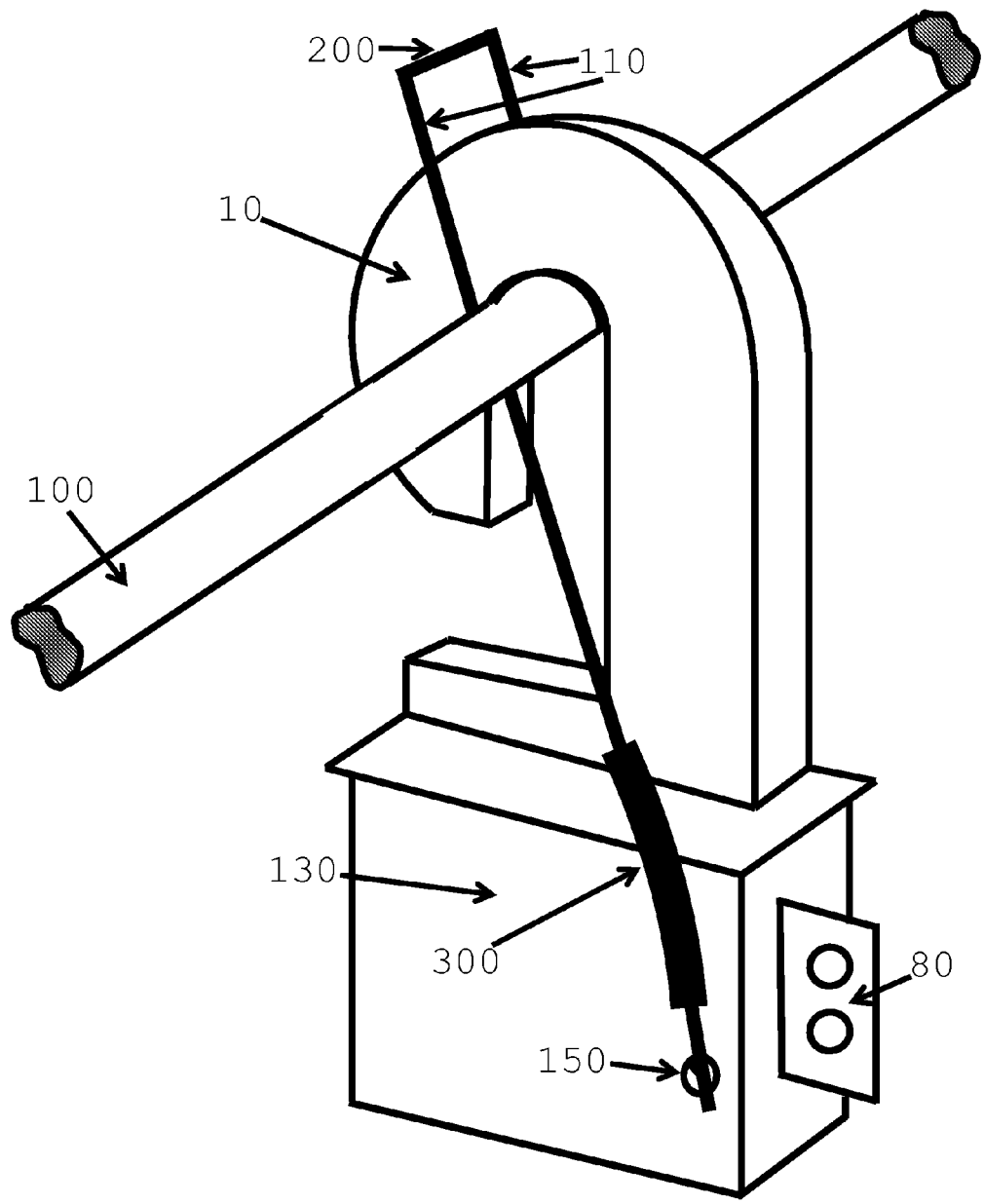
FIG. 7. is a schematic isometric view of a device in accordance with yet another additional embodiment of the present invention.

An additional embodiment of the present invention is shown schematically in FIG. 7. The attachment device for fastening an electrical cable monitoring instrument to an electrical cable 110 of this embodiment further comprises at least one elastic body 300 such that the elastic deformation and associated mechanical energy is predominantly stored in said elastic body or bodies.

The elastic body 300 of this embodiment can be an elastomeric body that can be made of elastomers such as polyurethane, synthetic rubber such as Buna or Neoprene, or any other elastic material elastically deformable in the directions perpendicular to the longest dimension of said elongated elastic member or members. When deformed, any elastomeric body acts as a reservoir storing mechanical energy.

In addition to elastomeric bodies, the elastic body 300 may consist of relatively tightly wound helical spring which is also deformable in the directions perpendicular to the longest dimension of said elongated elastic member or members. When deformed, said tightly wound helical spring acts as a reservoir storing mechanical energy.

Figure 8:
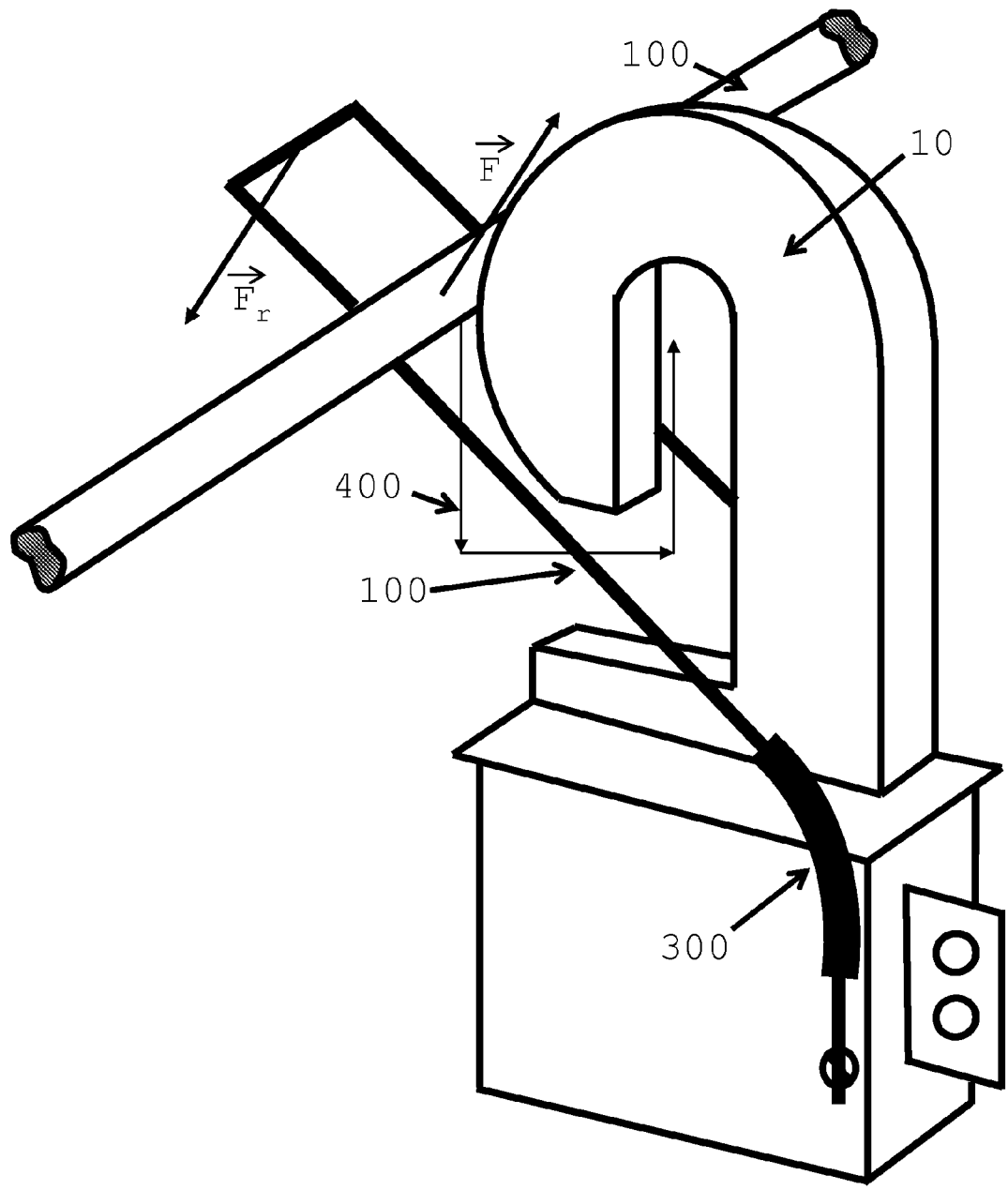
FIG. 8. is a schematic isometric view of a device in accordance with yet another additional embodiment of the present invention.

Same embodiment of the present invention is shown schematically in FIG. 8., during the process of attachment. The elastic force F acts on the electrical cable 100 while the reaction force $F_r$ deforms the elastic body 300 to a shape characterized by high mechanical energy such that deformed elastic member allows said electrical cable to travel along relative path 400 to gain access to the sensitive volume 20 at least partially surrounded by said monitoring instrument sensor 10.

Relaxing the force on the electrical cable 100 such that the resulting reactive force $F_r$ on the elongated elastic member or members allowing the elongated elastic member or members to relax to a shape characterized by lower mechanical energy than said high mechanical energy shape, and to apply elastic force to said electrical cable to hold the electrical cable passing through the sensitive volume firmly and securely in contact with the cable monitoring instrument with no relative motion.

As discussed previously while summarizing the invention in the "SUMMARY OF THE INVENTION" section, capability to perform listed operations intuitively, as a single continuous motion using a hot stick, is in the interest of safety and efficiency.

Figure 1:
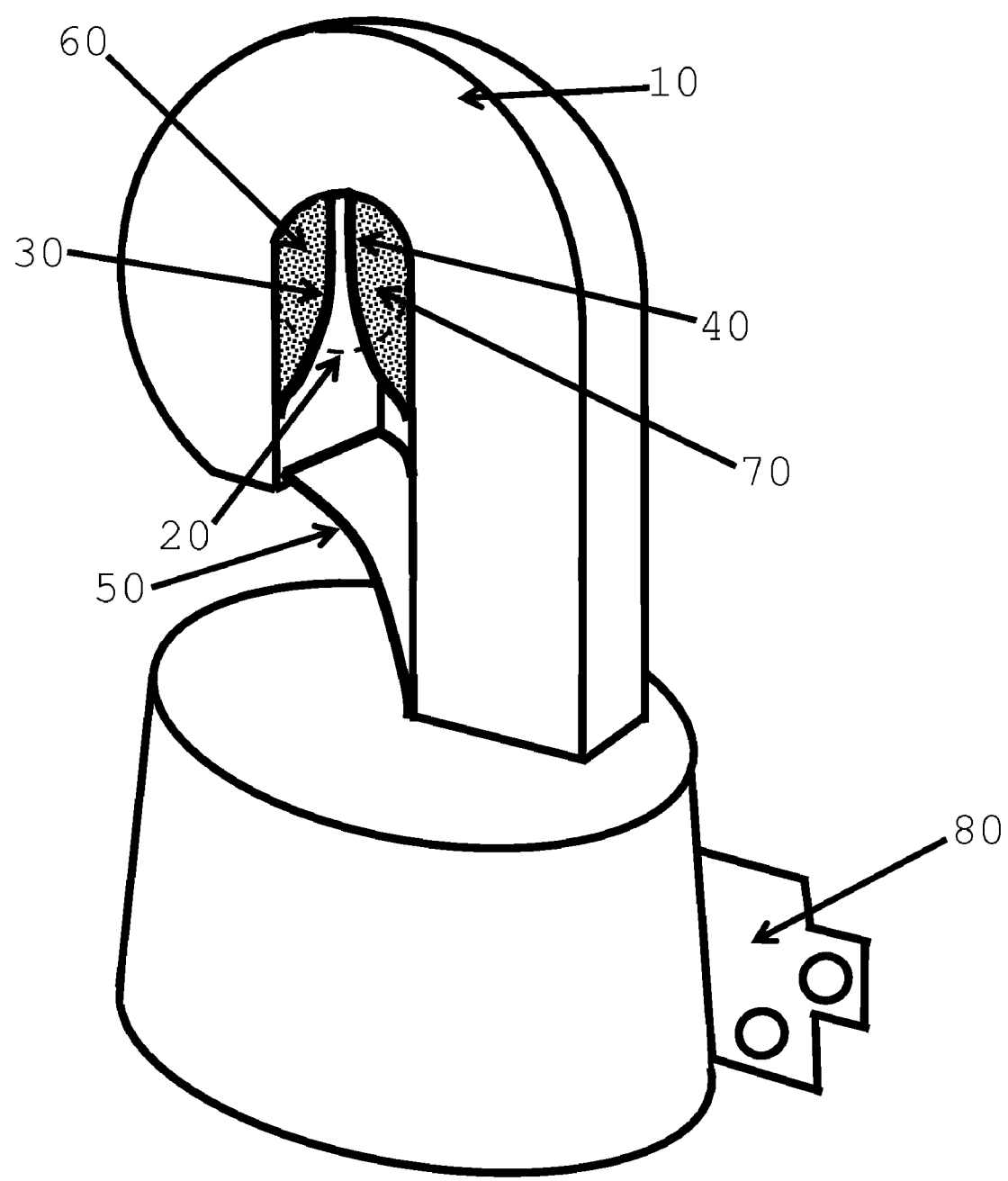
FIG. 1. is a schematic isometric view of a device in accordance with the prior art.
Figure 9:
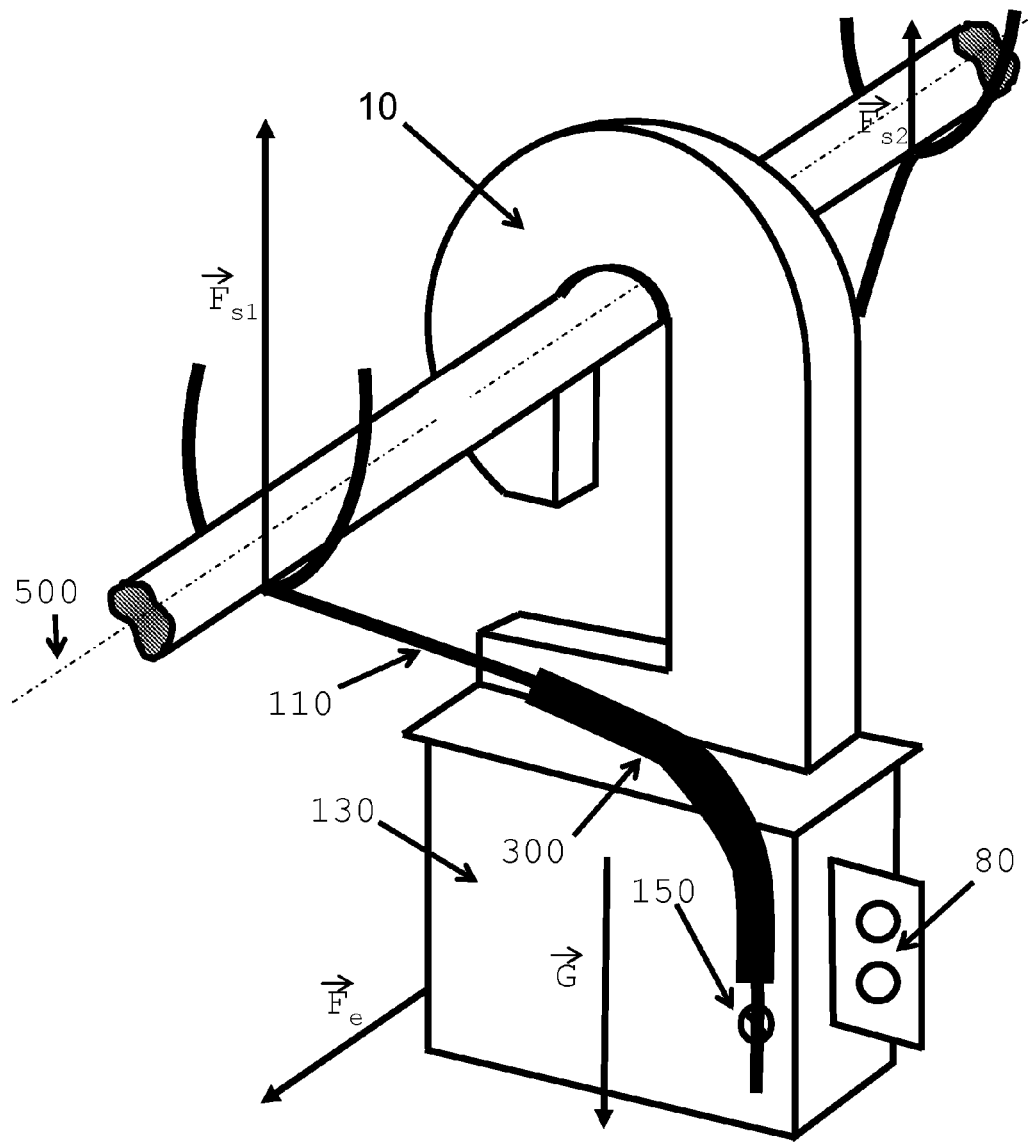
FIG. 9. is a schematic isometric view of a device in accordance with yet another additional embodiment of the present invention.

FIG. 9. depicts yet another embodiment of the present invention. In contrast to the embodiment depicted in FIGS. 1.-8., where elastic deformations of the elongated elastic members 110 are performed predominantly in the planes perpendicular to the electrical cable axis 500, the attachment device for fastening an electrical cable monitoring instrument to an electrical cable 110 in accordance with this embodiment the elastic deformation and associated mechanical energy is predominantly stored in at least one elongated elastic member 110 deformable in the plane containing electrical cable axis 500. The implementation of the attachment device is such that at least one force $F_s$ provided by the attachment device is in a direction which is opposed to the force of gravity G.

Particular features of the device in accordance with this embodiment is exceptional stability against the translational motions along the electrical cable axis 500, and stability against any rotation with respect to any rotational axis perpendicular to the electrical cable axis 500.

Any action by external forces $F_e$, directed to produce relative motion, induces the attachment device to apply additional stabilization force or forces $F_s$ against the electrical cable resulting in action to prevent relative motion and further stabilize the device in secure contact with the electrical cable.

Those features may be of special interest when electrical cables under surveillance exhibit high angles with respect to the horizontal plane, like power lines traversing steep hills, ore in places with prevailing strong winds along the transmission lines.

We claim:

1. An attachment device for fastening an electrical cable monitoring instrument to an electrical cable comprising:
    a monitoring instrument sensor arranged in a configuration of at least half a toroid like structure having at least one opening for positioning the electrical cable to pass through a sensitive volume at least partially surrounded by said sensor,
    at least one elongated elastic member securely attached to said cable monitoring instrument arranged that, when elastically deformed to a shape characterized by high mechanical energy, the deformed elastic member allows said electrical cable access to and from the sensitive volume at least partially surrounded by said monitoring instruments sensor, wherein
    said elongated elastic member, when relaxed to the a shape characterized by lower mechanical energy than said shape characterized by high mechanical energy, with the electrical cable positioned to pass through said sensitive volume, applies an elastic force to said electrical cable to hold the electrical cable passing through the sensitive volume firmly and securely in contact with the cable monitoring instrument with no relative motion.

2. The attachment device for fastening an electrical cable monitoring instrument to an electrical cable of claim 1, wherein the elongated elastic member is at least partially positioned outside the sensitive volume.

3. The attachment device for fastening an electrical cable monitoring instrument to an electrical cable of claim 1, wherein an elastic deformation and associated mechanical energy are predominantly localized in at least one elongated elastic member comprised of two elongated elastic parts joined by a connecting member, and said two elongated elastic parts are deformable in the plane perpendicular to the electrical cable axis.

4. The attachment device for fastening an electrical cable monitoring instrument to an electrical cable of claim 3, wherein two elongated elastic parts joined by a connecting member deformable in the plane perpendicular to the electrical cable axis further comprise one or more concave portions when observed from the direction originating on the cable axis, said concave portion or portions having at least one opening larger than the diameter of said electrical cable.

5. The attachment device for fastening an electrical cable monitoring instrument to an electrical cable of claim 1, wherein an elastic deformation and associated mechanical energy are predominantly localized in at least one elongated elastic member deformable in a plane containing said electrical cable axis.

6. The attachment device for fastening an electrical cable monitoring instrument to an electrical cable of claim 1, further comprising at least one short helical spring arranged that the elastic deformation and associated mechanical energy are predominantly localized in said short helical spring.

7. The attachment device for fastening an electrical cable monitoring instrument to an electrical cable of claim 1, further comprising at least one elastic body such that the elastic deformation and associated mechanical energy are predominantly localized in said elastic body.

8. The attachment device for fastening an electrical cable monitoring instrument to an electrical cable of claim 7, wherein the elastic body is an elastomeric body elastically deformable in the direction perpendicular to the longest dimension of said elongated elastic member.

9. The attachment device for fastening an electrical cable monitoring instrument to an electrical cable of claim 7 wherein the elastic body is a tightly wound helical spring deformable in the direction perpendicular to the longest dimension of said elongated elastic member.

10. The attachment device for fastening an electrical cable monitoring instrument to an electrical cable of claim 1, further comprising a Faraday shield arranged to partially enclose the electrical cable monitoring instrument.

11. The attachment device for fastening an electrical cable monitoring instrument to an electrical cable of claim 10, wherein at least one elongated elastic member is securely attached to said Faraday shield.

12. The attachment device for fastening an electrical cable monitoring instrument to an electrical cable of claim 10, wherein at least one elongated elastic member is securely attached to the monitoring instrument sensor not enclosed by, and separate from, the Faraday shield.

* * * * *